US008541256B2

(12) United States Patent
Wan

(10) Patent No.: US 8,541,256 B2

(45) Date of Patent: Sep. 24, 2013

(54) METHOD OF CADMIUM MOLECULAR BEAM BASED ANNEALS FOR MANUFACTURE OF HGCDTE PHOTODIODE ARRAYS

(76) Inventor: Chang-Feng Wan, Dallas, TX (US)

( * ) Notice: Subject to any disclaimer, the term of this patent is extended or adjusted under 35 U.S.C. 154(b) by 0 days.

(21) Appl. No.: 13/421,860

(22) Filed: Mar. 16, 2012

(65) Prior Publication Data

US 2012/0264254 A1 Oct. 18, 2012

Related U.S. Application Data

(60) Provisional application No. 61/476,299, filed on Apr. 17, 2011.

(51) Int. Cl.
*H01L 31/18* (2006.01)

(52) U.S. Cl.
USPC .................................... 438/84; 257/E31.018

(58) Field of Classification Search
None
See application file for complete search history.

(56) References Cited

U.S. PATENT DOCUMENTS 5,599,733 A * 2/1997 Wan et al. ..................... 438/558
5,742,089 A * 4/1998 Rajavel et al. ................ 257/442
5,780,322 A * 7/1998 Tamamura et al. ............. 438/45
7,560,747 B2 * 7/2009 Cok ................................ 257/98
7,858,872 B2 * 12/2010 Hotz et al. .................... 136/238
8,021,914 B2 * 9/2011 Hails et al. ...................... 438/95

* cited by examiner

*Primary Examiner* — Zandra Smith
*Assistant Examiner* — Damian A Hillman

(57) ABSTRACT

In the preferred embodiment of the present invention, narrow bandgap II-VI compound semiconductor $Hg_xCd_{1-x}Te$ ($0.1 \leqq x \leqq 0.5$) (HgCdTe) wafers are annealed under Cd super-saturated conditions by exposing the HgCdTe planar or mesa surfaces to a Cd molecular beam in a vacuum deposition system before, during, and/or after anneals performed during individual photodiode fabrication process steps or HgCdTe epitaxial growth steps for eliminating or neutralizing the bulk or interfacial defects.

21 Claims, 8 Drawing Sheets

18
16
14
12
10

METHOD OF CADMIUM MOLECULAR BEAM BASED ANNEALS FOR MANUFACTURE OF HGCDTE PHOTODIODE ARRAYS

The patent application claims priority date of U.S. Provisional Patent Application No. 61/476,299 filed Apr. 17, 2011.

FIELD OF THE INVENTION

The present invention relates to methods of anneal HgCdTe for passivating the surfaces annihilating vacancies, neutralizing dislocations, removing contaminants, and/or retarding impurity diffusion for manufacturing of infrared photodiode detector arrays.

BACKGROUND OF THE INVENTION

The present invention relates to anneal or thermal treatment, and/or surface passivation of semiconductor alloys of the formula Hg(1−x)Cd(x)Te wherein the x-value is between 0.1 and 0.5, generically referred to as "HgCdTe", which includes HgCdTe grown on lattice constant matched CdZnTe substrates and lattice constant and coefficient of thermal expansion (CTE) mismatched substrates such as Si. HgCdTe is a versatile infrared detector material whose bandgap can be varied by adjusting the x-value. For instance, x=0.2 corresponds to bandgap of ~0.1 eV for LWIR (long wavelength infrared) detection, x=0.3 corresponds to ~0.25 eV for MWIR (mid-wavelength infrared) detection and x=0.4 to 0.5 for SWIR (short wavelength infrared). The as-grown epitaxial HgCdTe materials have high density of defects such as dislocations due to the mismatched lattice constants and coefficient of thermal expansion (CTE), especially those epitaxially grown on Si substrate. Other defects such as metal vacancies, low, and Te-precipitates or inclusions, and interface fixed charge may also be present. Also there are extrinsic dopants such as arsenic and indium that needs to be activated to become electrically active. For eliminating the defects and activating the dopants, the HgCdTe materials are annealed or heat treated at various stages of material and device processing. These anneals or thermal treatments are mostly under Hg-rich condition provided by sealing the HgCdTe with a small amount of pure Hg in a fused quartz ampoule as depicted in FIG. 1. At 250 C anneal temperature the pure Hg provides a substantial vapor (0.3 atm), as can be seen in FIG. 2. Without the Hg-rich environment, a large concentration of Group II (metal) vacancy, which is a point defect, p-type dopant and S-R (Shockley-Reed) recombination center, can be generated, by loss of Hg from lattice sites to the atmosphere or Hg sinks. The equilibrium vacancy concentration has been determined and can be found in the literature. For instance, the vacancy concentration in HgCdTe (x~0.21) at 250 C is 2E15 cm-2 when anneal is done without the addition of Hg. At another popular anneal temperature of 370 C, the Hg partial pressure is 1.3 atm; which containment poses a challenge for manufacturing as a pressurized vessel is needed. Other HgCdTe anneals are also done under pressurized conditions in sealed ampoules. For example, U.S. Pat. No. 4,481,044 (1984) entitled "High-temperature Hg anneal for HgCdTe," Schaake, et al. used a Hg-anneal method to reduces the concentration of metal vacancies, prevents formation of dislocation loops or dislocation multiplication, as well as reduces tellurium precipitates which contribute to dislocation multiplication during subsequent post anneal. For another example, in U.S. Pat. No. 5,079,192 (1992) entitled "Method of preventing dislocation multiplication of bulk HgCdTe and LPE films during low temperature anneal in Hg vapor," Tregilgas, et al. disclosed a method of forming samples of alloys of group II-VI compositions having minimum dislocations, comprising the steps sealing a HgCdTe sample in an enclosed ampoule having the sample at one end portion thereof and a group II element of the compound at an end portion remote from the one end portion, heating the sample to a temperature in the range of 350 C while maintaining the group II element at a temperature more than 200 C. Also Farrell, et al. employed thermal cycle anneal (TCA) of MBE grown HgCdTe/Si Layers at ~400-500 C for dislocation reduction, Journal of Electronic Materials, Vol. 39, No. 1, page 43, 2010, where the anneal was also done in Hg-rich environment in sealed quartz ampoule. For passivation of HgCdTe surfaces, US 2003-0000454 A1 described using both Cd and Hg simultaneously at between 250 C and 400 C for annealing HgCdTe double layer or multilayer mesa photodiode structures in sealed quartz ampoules.

There have been attempts to anneal HgCdTe under Cd-rich condition. Wan, et al. suggested in U.S. Pat. No. 5,599,733 (1997), "Method using cadmium-rich CdTe for lowering the metal vacancy concentrations of HgCdTe surfaces" wherein HgCdTe was also coated with Cd and CdTe mixture and annealed at 250 C for annihilating the Hg vacancies. Cockrum et al. suggested in U.S. Pat. No. 5,880,510 a method of using a passivation layer by diffusing Cd on a junction interface of an HgCdTe junction diode, thereby increasing Cd composition ratio. According to the '510 patent, Cd or CdTe is thermally deposited on a junction interface of a HgCdTe junction diode and then annealed at 400 C. for 4 hours under a saturated Hg atmosphere. Cd from Cd or CdTe deposited by this process is diffused onto HgCdTe and Hg is diffused out of the HgCdTe, which raises the Cd composition ratio at the surface regions of HgCdTe. This is followed by annealing at 250 C. for 4 hours under a saturated Hg atmosphere in order to fill Hg voids generated in the crystal lattice of HgCdTe so that electrical characteristic can be controlled. Cockrum et al. teach that due to the high Cd composition ratio in surface regions of HgCdTe, electrons and holes are reflected therefrom and are prevented from rejoining together at the surface regions. The CdTe/Cd films were conductive due to the presence of Cd; they had to be removed by polishing for preventing surface shunting.

Suh, Sang-Hee et al. suggested a method for "Passivation of HgCdTe junction diode by annealing in Cd/Hg atmosphere" by forming a HgCdTe passivation layer with high Cd composition ratio on a HgCdTe semiconductor made of Group II-VI materials. They suggested annealing the HgCdTe in an anneal ampoule with both Cd and Hg sealed therein. The passivation layer was formed due to the Cd vapor generated by Cd while Hg vacancies were filled by the Hg vapor generated in the anneal ampoule. Thus deposition of CdTe film can be ignored for simplification. However, annealing the HgCdTe in a fused quartz ampoule with Cd vapor is impractical because the partial vapor pressure of Cd at 250 C are too low (~1/10,000) and gas phase diffusion coefficient, being inversely proportional to the square root of the total pressure, is too low as well, which make the transport of the Cd source from source end of the ampoule to the HgCdTe substrate/wafer end difficult.

There were reports of using Cd for enhancing arsenic doping efficiency during growth of CdTe buffer layer by MBE. The crystallinity of CdTe buffer layers grown at 300 C was improved when the Cd/Te flux ratio was 1.8 (K. Maruyama, et. al. Journal of Crystal Growth Volume 137, Issues 3-4, 1 Apr. 1994, Pages 435-441). The purpose of using Cd flux was for growing CdTe buffer layer, not for annealing HgCdTe.

Surface passivation for getting rid of surface (interface) fixed charge and/or interfacial defect is an important aspect for the fabrication of HDVIP (High Density Vertically Integrated Photodetectors). A complex process called double-side interdiffusion (DSID) as described in U.S. Pat. No. 5,846,850 of Dreiske, et al., has been used for passivation of both front and back side of the HgCdTe on a CTE matched CdZnTe "sacrificial substrate" for avoiding dislocations generated by using CTE-mismatched Si substrate albeit the latter is much cheaper. The "sacrificial substrate" process is tedious and difficult to control; an alternate process that allows the 250 C passivation anneal to be performed after the bonding without damaging the HgCdTe is simpler and much easier to control.

Fabrication process of bump-bonded HgCdTe focal plane array (FPA) is depicted herein. First double-layer 12 and 14 or Hg(1−y)Cd(y)Te/Hg(1−x)Cd(x)Te (x<y) heterojunction (DLHJ) structure is grown by MBE (molecular beam epitaxy) or LPE (liquid-phase epitaxy) on CdZnTe or an alternate substrate 10 (FIG. 4*a*), where the upper HgCdTe layer is heavily doped p-type and the lower layer is lightly doped n-type. Then mesa diodes are reticulation by etching for forming trenches in the DLHJ structure as shown in (FIG. 4*b*), and a CdTe surface passivation layer 18 is deposited on the top and sidewall surfaces of the mesa structure by thermal evaporation in a vacuum deposition system shown in FIG. 3. In order for the passivation layer 18 to be effective, the CdTe/HgCdTe heterostructure is annealed at 250 C for several days in a system shown schematically in FIG. 1, where CdTe molecular beam is generated by heating CdTe solids in a Knudsen cell or a crucible and evaporate it into a CdTe flux comprising Cd, Te, and Te2 gas molecules, which condense on the HgCdTe substrate surface and form CdTe films. A flux monitor is used to measure the CdTe flux in real time. Additional beam sources can be inserted in the reaction chamber for co-deposition. FIG. 4*c* is schematic cross-section of the HgCdTe DLHJ mesas photodiode array 14 having trenches 16 for isolating the mesa photodiodes and CdTe layer 18 deposited on the sidewall of the trenches 16 for passivation. Finally, ohmic contact metal studs 8 are formed on each photodiode. FIG. 4*d* shows the cross-section of finished HgCdTe DLHJ photodiode array.

FIG. 5 shows the geometry of a planar HgCdTe heterojunction photodiode. It features a n-type HgCdTe layer 12 having low x-value (~0.2) HgCdTe grown on CdTe substrate 10 with a CdTe passivation thin film 18 deposited on its top surface, a n-type HgCdTe layer 14 having high x-value (~0.3), and small, localized arsenic-doped regions 20 in high x-value layer slightly spreading into the low x-value, n-type region 12 to the is formed in the HgCdTe to form a p-n junction whose boundary terminates at the top surface, which is passivated with a layer of CdTe and passivation annealing to avoid deleterious effects of excessive fixed charge and/or traps. An ohmic contact 8 is provided to make contact with the p-regions. Similar diode structure can be formed as homojunction photodiodes. This device structure does not require trenches but the p-n junction terminates at the top surface which must be passivated as well.

Newer generation DLHJ photodiodes have minimal diode area and very narrow trenches between them. The depth of the trenches cannot be scaled accordingly, however, giving rise to high aspect ratio trenches with steep sidewalls (FIG. 4*e*) that are difficult to coat completely with conventional vacuum deposited protective films. Additionally plasma etch processes with highly directional energetic ions used to etch the trenches invariably induced damages to the HgCdTe surface. The uses of these plasmas etch processes result in clean carbon and oxygen free surfaces with little Hg depletion. However, the moment they are removed from vacuum oxygen and hydrocarbon contamination start to build on the surface. An in-situ or minimally in-vacuo process to be developed that will chemically and electrically passivate high aspect ratio HgCdTe surfaces is needed. This passivation must be able to be vacuum compatible and not dope the HgCdTe it is passivating. More importantly, non-conventional methods such as atomic layer deposition (ALD), where mono-atomic layers of Cd and Te are deposited alternately, are needed to ensure good sidewall coverage even though the deposition rate of ALD process is very slow and must be performed at elevated temperatures of >250 C.

FIG. 6 depicts another HgCdTe photodiode architecture. The photodiodes are in form of vertical n-on-p homojunctions, they are called high density, vertically integrated photodiodes, or HDVIP because the p-n junction runs vertically from the top to the bottom surfaces. FIG. 6 shows schematic cross-section of photodiodes formed on a HgCdTe layer 20, which is adhesive bonded to ROIC (Readout IC) 10 with a thin epoxy layer 18, wherein localized n-type regions 12 are formed in the 10-um thick p-type HgCdTe layer, which is doped with the Group IIB vacancies and Copper. The HgCdTe layer with both front and back surfaces passivated with CdTe layers 18 using the DSID (double sided interdiffusion) process as described in U.S. Pat. No. 5,846,850. The HDVIP photodiodes are formed by using reactive ion etch (RIE) to form via holes 6 through the p-type HgCdTe layer. The energetic ions in the RIE removes Te and Cd during the etch from the via holes to free up Hg atoms, allowing them to diffuse interstitially in the HgCdTe matrix to annihilate the vacancies, displace and replace the copper impurity dopants to convert HgCdTe regions 12, which is within a few microns around the vias, from p-type to n-type, by lowering the p-type doping concentration to below that of indium, which is an n-type dopant, originally introduced into the HgCdTe, at a level of ~5E14 cm-2. Metal layer 8 was deposited on the side and bottom of the via holes to form contact/metal interconnections between the photodiodes and the landing pads 22 in the ROIC 10. It should be noted that as described in U.S. Pat. No. 5,846,850, the HgCdTe was thinned to 10 um before both of its top and bottom surfaces were passivated with CdTe and interdiffusion annealed; the process is cumbersome as it require the thinned HgCdTe to be mounted on CTE-matched CdZnTe substrates temporarily with heat resistant epoxy for thinning and passivation anneal operations. The CdZnTe substrate must be removed from the HgCdTe after the stack is epoxy bonded to ROIC.

It can be seen that essentially all of the prior art HgCdTe anneal methods suggested using seal quartz ampoules to contain the Hg- or Cd-vapors needed. However, quartz ampoules are limited in size and for one-time use only; they cannot accommodate 6" or larger wafers or be reused. In theory, Cd, which is in the same group as Hg in the Periodic Table, can be used for to replace Hg in annealing HgCdTe as an alternative to the Hg-rich anneal. In practice, however, it is difficult to use Cd in sealed ampoules. The main reason is the vapor pressure of Cd being too low. For instance, the vapor pressure of Cd at a common anneal temperature of 250 C is less than 1E-5 atm, in contrast to 0.1 atm of the commonly used Hg. Such a low vapor pressure was difficult to apply or control accurately or reproducibly and was not expected to keep metal vacancies from being generated from losing Hg to vaporizing from HgCdTe. Adding Hg to the Cd is not practical either, because Hg can act as a sink for Cd, and its overwhelming pressure diminishes Cd's presence to trace amount, which is difficult to control or adjust for the proper value of anneal.

SUMMARY OF THE INVENTION

The main embodiment of the present invention is the method of using Cd molecular beam for the metal-rich anneals of HgCdTe in a dynamic vacuum deposition system instead of in static sealed quartz ampoules for the purposes of surface passivation, defect reduction and/or dopant activation. The applicable HgCdTe defects include Hg vacancies, dislocations, precipitates, and fixed charges. They are introduced during HgCdTe epitaxial growth and/or device fabrication for manufacture of HgCdTe infrared photodiode arrays.

BRIEF DESCRIPTION OF THE DRAWINGS

For a better understanding of the invention with regard to the embodiments thereof, reference is made to the accompanying drawings, in which like numerals designate corresponding elements or sections throughout, and in which.

DETAILED DESCRIPTION OF THE PREFERRED EMBODIMENTS

Figure 1:
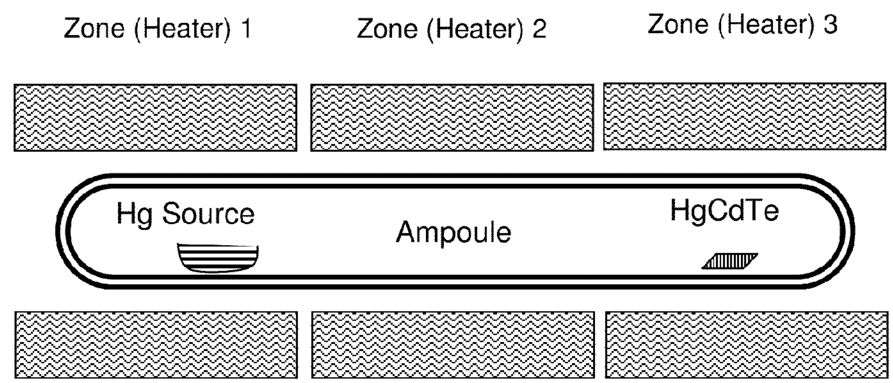
FIG. 1 Apparatus for annealing HgCdTe in sealed ampoule with a metal vapor source.
Figure 2:
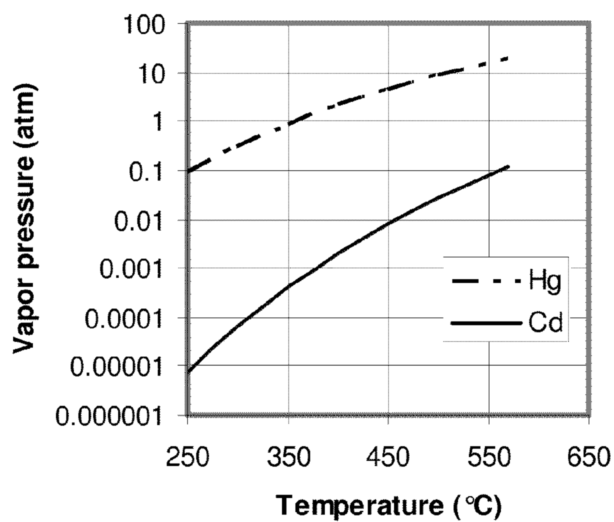
FIG. 2 Equilibrium partial pressures of elemental Hg and Cd as functions of temperature.
Figure 3:
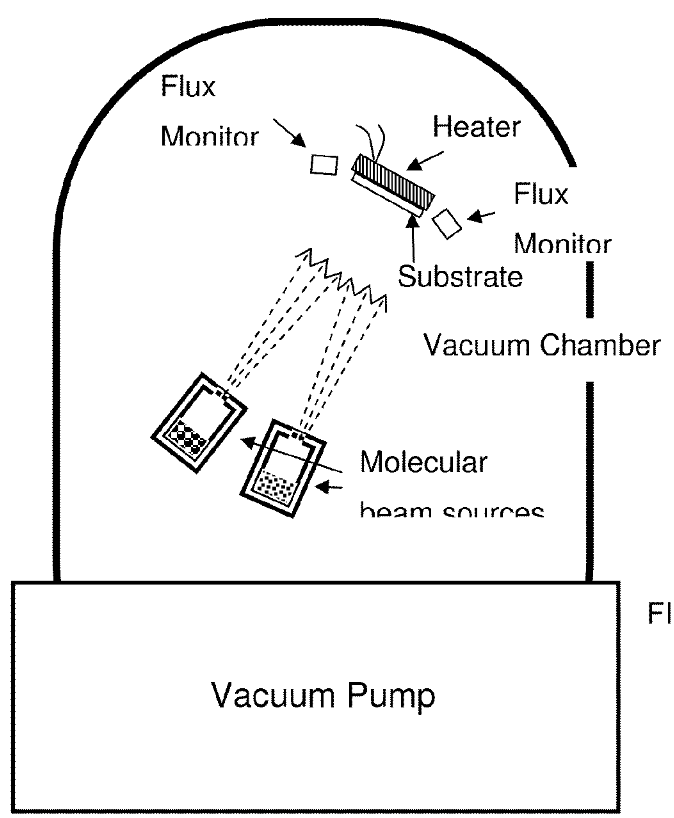
FIG. 3 Apparatus for thin film deposition in a vacuum chamber using molecular beams impinging upon a heated substrate.
Figure 7A:
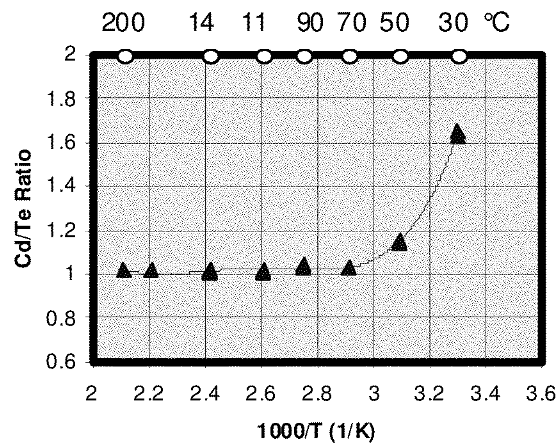
FIG. 7*a* Measured Cd/Te ratio for CdTe films prepared by vacuum deposition from CdTe and Cd molecular beams as a function of temperature, where CdTe flux is at 6 Å/sec and Cd flux is 2 A/sec.
Figure 7B:
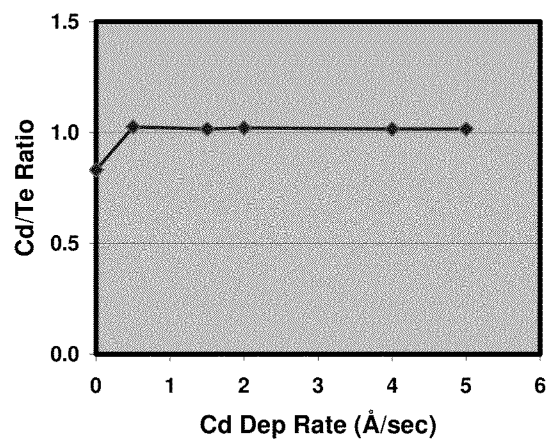
FIG. 7*b* Measured Cd/Te ratio for CdTe films prepared by vacuum deposition from CdTe and Cd molecular beams as a function of Cd flux where temperature is at 140° C. CdTe flux is at 6 Å/sec.

The present disclosure embodies inventive method of treating HgCdTe material by impingement of Cd molecular beam upon its surface in a vacuum deposition system at various stages of material growth and/or photodiode fabrication process steps for improving the infrared focal plane array (FPA) performance. It is based on findings describe below. In a vacuum deposition study of CdTe film deposition on Si substrate using CdTe and Cd dual molecular beams, the films deposited was a mixture of CdTe and Cd at room temperature, which is as expected. However, when the substrate temperature was raised, the amount of Cd deposited decreased rapidly as shown in FIG. 7*a*, which plots Cd/Te ratio in the deposited film as a function of inverse temperature for fixed CdTe and Cd fluxes of 6 A/sec and 2 A/sec, respectively. The Cd/Te ratio of the film was 1.6 at room temperature; it decreased 1.0 when the temperature was increased slightly to ~65 C and stayed constant at 1.0 with further increase in temperature. This suggested that when the substrate temperature is higher than 65 C, Cd molecules will stick to the surface when there were dangling Te covalent bonds to bond to form Cd—Te bonds, but the nucleation energy barrier for precipitating pure Cd was too high to materialize. FIG. 7*b* shows the Cd/Te ratio for CdTe and Cd co-evaporated film deposited on a substrate at 140 C, where CdTe flux was at 6 A/sec, while Cd flux was varies from 0 to 5 A/sec. It can be seen when there is no Cd evaporation, the Cd/Te ratio in the CdTe film is less than 1.0, which is probably due to scattering of the lighter Cd from the molecular beams, and Cd flux of 0.5 A/sec was sufficient to compensate for that loss and saturate the CdTe film with Cd. Further increase in Cd flux by as much as ten fold (5 A/sec) did not result in excess Cd in the CdTe film. According to the gas kinetics theory, a Cd molecular beam with 2 A/sec of flux at 800K corresponds to a gas pressure of 8E-6 atm which is about 1000× the equilibrium partial pressure (8E-9 atm) of Cd at 140 C according to FIG. 2. This shows a very large degree of supersaturation can be tolerated for Cd deposition if it is in form of molecular beam in high vacuum. The self-limiting and tolerance to high supersaturation characteristics of Cd can be used to overcome several technical challenges for manufacturing HgCdTe infrared focal plane arrays. For instance, the Hg-rich environment used for HgCdTe anneals can be replaced with Cd molecular beam with medium vacuum pressure. Thereby the sealed ampoule used in Hg anneal can be replaced with a vacuum deposition chamber with a substrate heater and beam source. The method of applying Cd molecular beam on HgCdTe substrate surface during anneal is termed CRAVES (Cadmium-Rich Anneal using Vacuum Evaporation System). However, CRAVES alone does not guarantee success in annihilating the metal vacancies.

In a preferred embodiment of the present invention, HgCdTe substrate is heated in a vacuum deposition system to between 70 C and 300 C and its front surface is subjected to impingement of a Cd (molecular) beam generated from a Knudsen cell (K-cell) with a suitable Cd flux over its corresponding its equilibrium partial pressure of metal-rich HgCdTe. The excess Cd provides a driving force for the Cd to diffuse from the surface into the HgCdTe to annihilate the metal vacancies. During the vacancy filling by Cd molecular beam impingement, it is possible some of the Hg lattice atoms can leave their lattice sites diffuse to the surface and leave by vaporization to generate vacancies, as mentioned before. This mechanism can occur at temperature as low as 110 C, where the equilibrium vacancy concentration is ~1E14 cm-3 under metal deficiency. However, as long as the impingement of Cd molecular beam is provided, this out-diffusion of Hg is suppressed by the influx of Cd, and the vacancies can be filled by Cd as soon as they are created. Therefore, the Cd beam should not be shut off completely during anneal until the substrate temperature is cooled to 100 C.

Figure 8A:
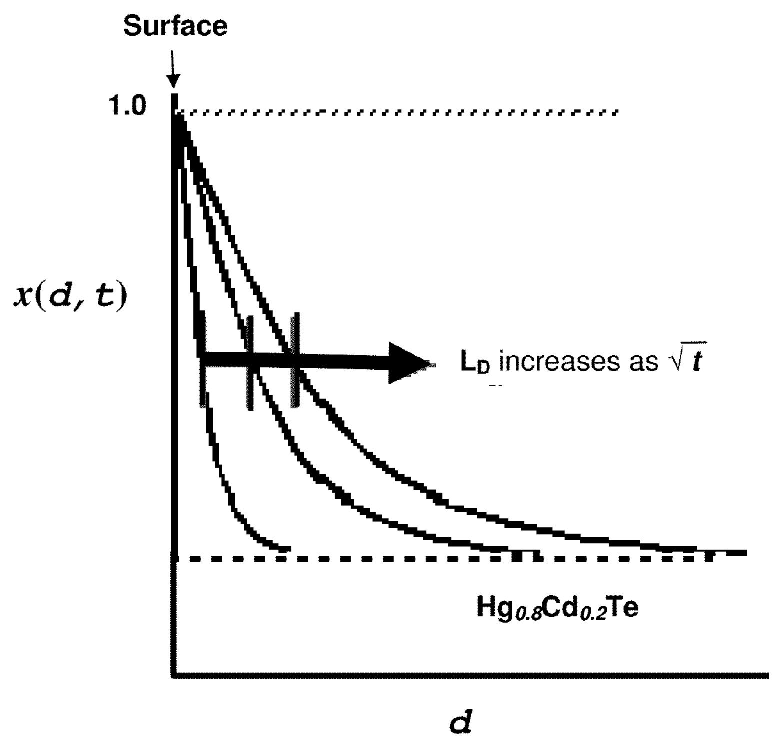
FIG. 8*a* Theoretical concentration profile of Cd in HgCdTe during its diffusion from the surface into the HgCdTe when Cd activity at the gas/solid interface is in supersaturation.
Figure 8B:
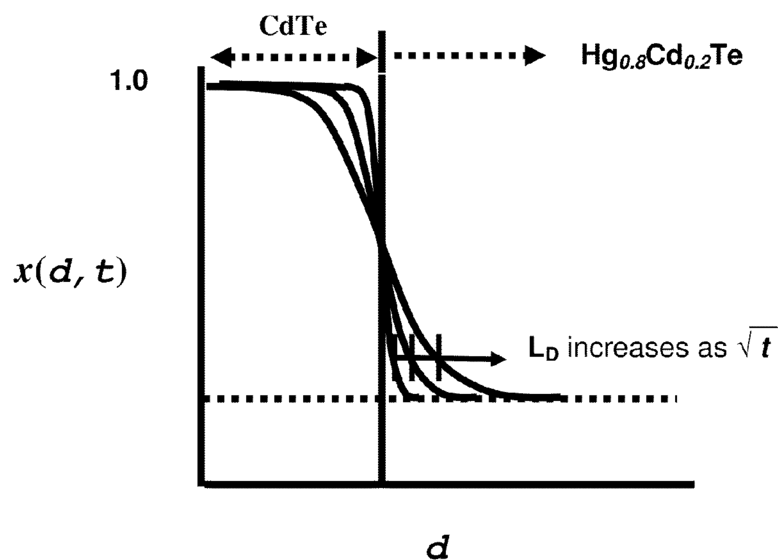
FIG. 8*b* Theoretical concentration profile of Cd during the interdiffusion of CdTe film deposited on HgCdTe and the HgCdTe where Cd diffused into the HgCdTe and Hg diffuses in the opposite direction into the CdTe.

In another preferred embodiment, Hg(1−x)Cd(x)Te bulk or epitaxial layer is subjected to CRAVES at a temperature between 150 C and 350 C and its front surface is which entails impingement of a Cd (molecular) beam generated from a Knudsen cell (K-cell) in a vacuum deposition system with a flux substantially higher than the saturation point. With ample time, substantial interdiffusion between Cd and Hg occurs at the HgCdTe surface to create a >200 A deep skin of x-value larger than 0.3. The depth profile can be described by following one-dimensional diffusion equation:

$$x(d,t) = x(0)\mathrm{erfc}\left(\frac{d}{2\sqrt{Dt}}\right) + x(\infty)\left[1 - \mathrm{erfc}\left(\frac{d}{2\sqrt{Dt}}\right)\right] \qquad \text{Eq. (1)}$$

where t is time of the anneal, d is the position from the surface located at position d=0, erfc(z) is complementary error function, and D is the diffusion coefficient. FIG. 8*a* depicts x-value profile with respect to depth after anneals of 3 different time durations as dictated by Eq. (1). Assuming a minimum value of 1.0 for x(0), whereas x(∞)=0.2 for the LWIR Hg(1−x)Cd(x)Te (x=0.2), at two diffusion length, (4D·t)^0.5, is ~0.3, which is in the SWIR (short wavelength infrared) regime. In the preferred embodiment, proper combination of temperature and time such as 250 C for 4 hr anneal gives rise to >200 A of graded bandgap layer with x-value of >0.3 similar to those shown in FIG. 8*a*. Such layer is adequate for shielding or passivating detrimental surface effects from the LWIR HgCdTe region. Therefore, surface passivation is achieved by increasing the x-value at the defective HgCdTe surface or interface region so that trap-assisted tunneling is reduced and fixed charge induced surface inversion is eliminated. The prior-art CdTe passivation, on the other hand, involves depositing CdTe thin film on the HgCdTe surface, and annealing through 250 C/96 hour for a graded bandgap region to form at the CdTe/HgCdTe interface by interdiffusion between Cd and Hg across the interface as shown in FIG. 8*b*. Apparently surface passivation using CRAVES directly on HgCdTe surface can be significantly faster than the prior-art CdTe passivation for two reasons: (1) Cd can be supersaturated in CRAVES (2) the prior-art passivation uses CdTe layer which impedes Cd diffusion. The prior-art CdTe passivation can be expedited by CRAVES by its capability of imposing supersaturation without affecting the surface.

Figure 4A:
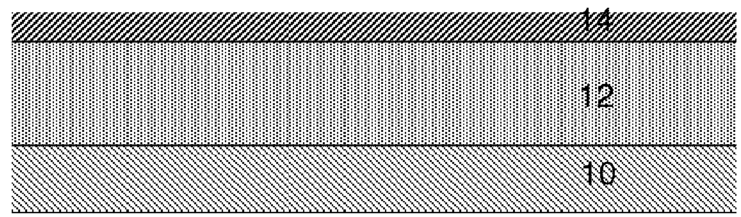
FIGS. 4*a* to 4*d* Schematic cross-sections of an HgCdTe double layer heterojunction photodiode array at various stages of its fabrication.
Figure 4B:
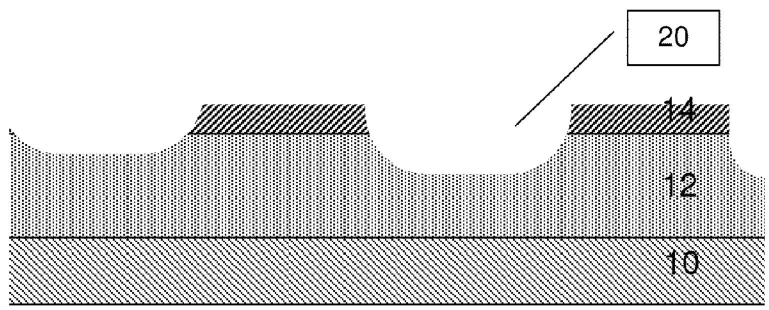
Figure 4C:
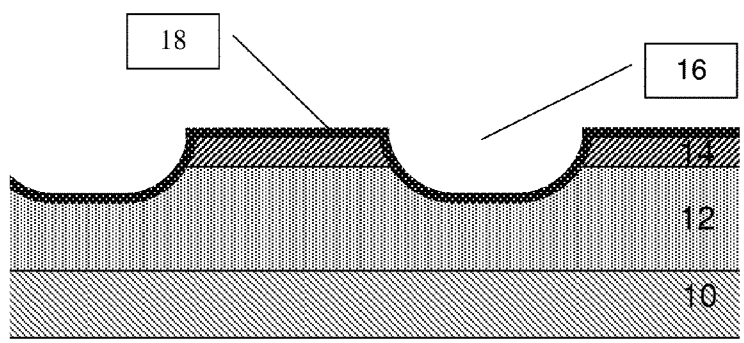
Figure 4D:
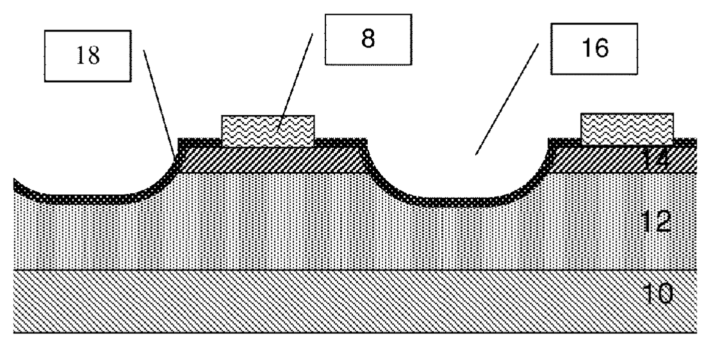
Figure 4E:
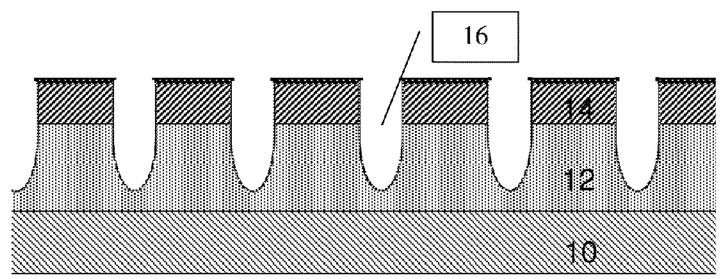
FIG. 4*e* Schematic cross-sections of an HgCdTe double layer heterojunction photodiode array having reticulated high aspect-ratio trenches for isolating individual photodiodes.
Figure 5:
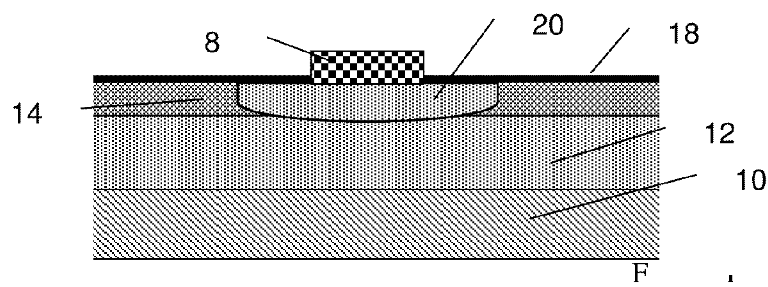
FIG. 5 Schematic cross-section of a planar HgCdTe p-on-n junction photodiode with CdTe passivation, using an epitaxially grown sensing material, and a bulk sensing material.
Figure 6:
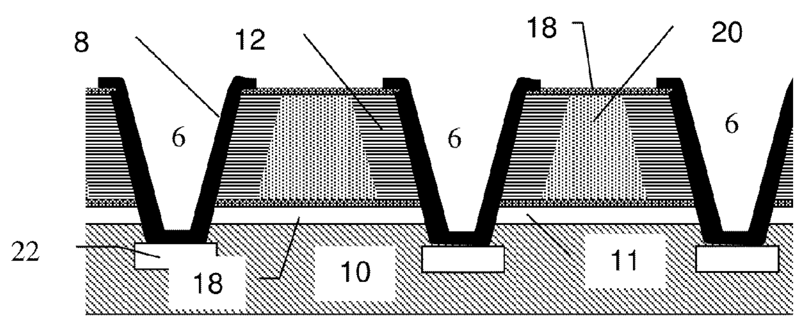
FIG. 6 Schematic cross-sections of a HDVIP planar HgCdTe photodiode array using ion implantation to form n-type sensing region in a p-type bulk sensing material.
Figure 8C:
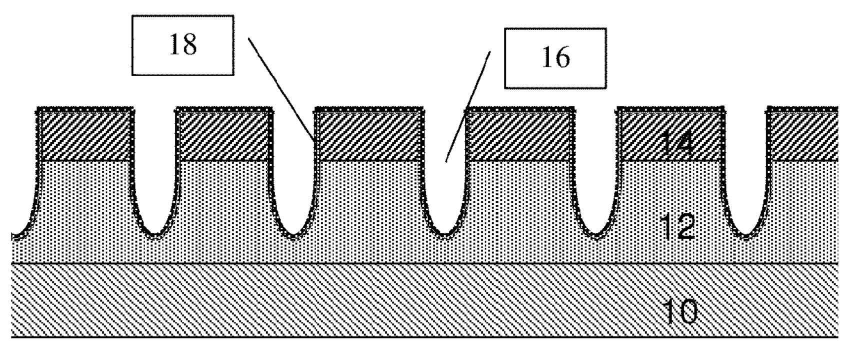
FIG. 8*c* Schematic cross-sections of an HgCdTe double layer heterojunction photodiode array having reticulated high aspect-ratio trenches for isolating individual photodiodes, where the trench surfaces are converted to higher x-values with graded concentration profile similar to those in FIG. 8*a*.

A significant advantage of using CRAVES for HgCdTe surface passivation is it is insensitivity to surface topography found in mesa photodiode arrays especially when the mesa diodes are small where the aspect ratio of the trenches between the mesas are high as shown schematically in FIG. 8*c* due to the fact there is very little mass transport involved in CRAVES passivation, while the prior-art CdTe passivation which involves CdTe deposition is prone to poor sidewall coverage of the line-of-sight deposition process. Therefore, the advantages of the present invention of using CRAVES for surface passivation are: (1) Availability of commercially available turnkey systems such as MBE reactor and vacuum evaporator enables low cost, high throughput for increased production worthiness. (2) Wider process windows as a result of the process's high tolerance to supersaturation. (3) Faster interdiffusion shortens anneal time and/or temperature. (4) In-situ processing for vacancy annihilation, CdTe deposition, HgCdTe growth, and/or passivation anneals. (5) Insensitive to surface topography as very little mass transport is involved; otherwise, the high aspect-ratio trenches in the mesa photodiode structures shown in FIG. 4*e* may be difficult to cover with deposited CdTe films.

In another preferred embodiment, the backside surface of a CdTe substrate is coated with a Group-VI(b)b rich film such as Te-rich CdTe, Te, ZnS, CdS, and CdSe, then the front surface is subjected to CRAVES at ~450 C for several hours. A pure Te layer or Te-rich CdTe layer, serves as a sink or getter for Group I(b) impurities such as copper, which is the predominant impurity in HgCdTe, and for Cd as well. Since Cd has stronger binding energy to Te than copper to Te, it can displace copper effectively and its diffusive flux from front side to backside can move the copper, which is diffusing to the backside by itself due to the sink, with it to be combined with the by the Group-VI(b) rich layer at the backside. After sufficient time is allowed for the diffusions, the substrate is cooled to ~90 C, the Cd flux is subsequently stopped, and then the getter layer on the backside is removed, resulting in a purer CdTe substrate. Needless to say this process can be repeated several times to lower the impurity concentration further.

In yet another preferred embodiment, HgCdTe epitaxially grown on low cost but lattice- and/or thermal-expansion mismatched substrates such as Si, GaAs, and Ge, are thermally cycled to 400-500 C with CRAVES instead of Hg-rich anneal in quartz ampoule for reducing the dislocation density for fixing the latter's disadvantage of high vapor pressure, which stands at 10 atm at 500 C; a pressure too high for ampoules large enough to accommodate 6" or larger wafer to be used in production. Hence, use of CRAVES for thermal cycle anneal for dislocation reduction have the advantages of (1) availability of commercially available turnkey systems for low cost, high throughput production worthiness, (2) wider process windows, (3) shorter process time (due to higher degree of supersaturation).

Another preferred embodiment pertains to HgCdTe epitaxial materials grown on inexpensive alternate substrates (Si, GaAs, Ge) being temper annealed (stress relief annealed) at between 90 C and 150 C for extended period of time of between 0.5 to 24 hours while its front surface is subjected to impingement of a Cd (molecular) beam generated from a Knudsen cell (K-cell) in a vacuum deposition system with a flux substantially higher than the onset of the plateau region in FIG. 7*a*. The temper anneal relieves thermal stress on HgCdTe at the lower temperatures where the stiffness of HgCdTe is much higher, while the Cd (molecular) beam provides constant passivation for any stress-induced dislocations formed during cooling.

Another preferred embodiment pertains to double-side CdTe passivation of HgCdTe for the fabrication of p-on-n photodiode arrays. In this preferred embodiment, HgCdTe epilayer grown on CdZnTe or silicon substrate has its front side coated with 2000 A of CdTe film and annealed in vacuum or inert atmosphere at 250 C for 4 days to set the vacancy concentration at ~2E15 cm-3 level and passivate the CdTe/HgCdTe interface. Next the HgCdTe is epoxy bonded with to a readout IC (ROIC) with its coated front surface down. Then the CdZnTe/HgCdTe epilayer structure is diamond point turned from the backside and polished to a thickness of ~10 um. Next one of the CRAVES passivation processes as described earlier is carried out for passivating the polished surface. Before cooling after the passivation, the Cd flux may be turned off for at least 15 minutes to allow the Hg vacancies to form for doping the HgCdTe with p-type of desired level with the vacancies. Then rapid cooling by quenching in a liquid such as water or liquid nitrogen or with forced air is done to cool the HgCdTe to room temperature while limiting the dislocation motion of thermal stress from dislocation multiplication and preventing the vacancy concentration from changing which can happen if the cooling is slow. And the HgCdTe layer on ROIC structure is ready for photodiode fabrication. This embodiment eliminates the tedious "DSID"

(Double-Sided Inter-Diffusion) process where a temporary CdZnTe carrier, which had to be sacrificed, was used for interdiffusion anneal.

Since CRAVES is carried out in a vacuum system, all the preferred embodiments describe heretofore are compatible with in situ or in vacuo processing with other HgCdTe material growth or device fabrication processes that are done in vacuum to limit the exposure to the air and for sharing the vacuum system.

Having described the invention with regard to certain specific methods and compositions, it is to be understood that the description is not meant as a limitation, since further modifications may now suggest themselves to those skilled in the art, and it is intended to cover such modifications as fall within the appended claims.

I claim:

1. A method for thermal treating a HgCdTe layer on a substrate in accordance to the following process steps in this order:

(1) placing said HgCdTe layer in a vacuum deposition system equipped with a Cd molecular beam source, (2) heating said HgCdTe layer to an elevated temperature for anneal or thermal treatment, (3) Impinging the front surface of said HgCdTe layer with said Cd molecular beam with a flux exceeding that for Cd saturation of said front surface for at least 15 minutes during said anneal, (4) cooling said HgCdTe layer to a certain ending temperature, (5) turning off said Cd molecular beam, and (6) cooling said HgCdTe layer to room temperature.

2. The method as set forth in claim 1, wherein said ending temperature is between 80 and 140 C.

3. The method as set forth in claim 1 wherein said HgCdTe layer has mesas and/or trenches formed thereon before said anneal.

4. The method as set forth in claim 3, wherein the formation of said mesas and/or trenches and said annealing are performed in situ.

5. The method as set forth in claim 1 wherein said HgCdTe layer comprises un-activated or partially activated extrinsic dopant such as arsenic.

6. The method as set forth in claim 1 further comprises a step for depositing a CdTe film using an additional Te-containing source in said step (3).

7. The method as set forth in claim 6, wherein said CdTe film is deposited by atomic layer deposition means.

8. The method as set forth in claim 6, wherein said CdTe film is deposited in part from a Te molecular beam source with a flux significantly exceeded by said flux of said Cd molecular beam.

9. The method as set forth in claim 1, wherein said Cd molecular beam comprises only elemental Cd.

10. The method as set forth in claim 1, wherein said substrate comprises silicon, germanium or GaAs whereon said HgCdTe layer is grown by heteroepitaxy means.

11. The method as set forth in claim 1, wherein said elevated temperature is 70 C or higher.

12. The method as set forth in claim 1, wherein said time and said temperature are such that at least 200 A of graded bandgap layer with the x-value higher than 0.3 is formed on said HgCdTe surface due to Cd diffusion from said Cd molecular beam.

13. A method as set forth in claim 1, wherein said elevated temperature is cycled between 250 C and 550 C at least twice.

14. The method as set forth in claim 1, wherein said substrate comprises silicon or ROIC.

15. A method for removing copper impurity from a CdTe or CdZnTe substrate comprising the following process steps in this order:

(1) Depositing a Te-rich CdTe layer on the backside of said substrates, (2) placing said substrates in a vacuum deposition system equipped with a Cd molecular beam source, (3) heating and annealing said substrate at elevated temperatures, (4) Impinging the front surface of said HgCdTe layer with said Cd molecular beam having Cd flux intensity substantially exceeds that for Cd saturation for at least 15 minutes during said annealing, (5) cooling said substrate to room temperature, (6) removing said Te-rich CdTe layer from said CdZnTe by lapping or etching.

16. The method as set forth in claim 15 is repeated at least once.

17. The method as set forth in claim 1, wherein said elevated temperature is higher than 70 C.

18. The method as set forth in claim 1, wherein said significant amount is 100% or more.

19. The method as set forth in claim 1, wherein said Cd molecular beam comprises Cd metallorganic compound.

20. The method as set forth in claim 1, wherein said Cd molecular beam is generated by sputtering.

21. The x-value profile of HgCdTe layer from its bare surface or its interface with an insulator layer near a p-n junction formed in said HgCdTe layer assumes that of one-sided diffusion wherein the x-value at said surface or said interface is 1.0 and decreases monotonically and continuously with depth to the starting or bulk x-value of said HgCdTe layer without any inflection point.

* * * * *